United States Patent
Dasgupta

(10) Patent No.: US 10,050,648 B1
(45) Date of Patent: Aug. 14, 2018

(54) TRANSMITTER CIRCUIT AND METHOD FOR DIGITAL SATELLITE EQUIPMENT CONTROL

(71) Applicant: STMicroelectronics International N.V., Schiphol (NL)

(72) Inventor: Nabarun Dasgupta, New Delhi (IN)

(73) Assignee: STMicroelectronics International N.V., Schiphol (NL)

( * ) Notice: Subject to any disclaimer, the term of this patent is extended or adjusted under 35 U.S.C. 154(b) by 0 days.

(21) Appl. No.: 15/668,942

(22) Filed: Aug. 4, 2017

(51) Int. Cl.
*H04B 1/04* (2006.01)

(52) U.S. Cl.
CPC .................................... *H04B 1/04* (2013.01)

(58) Field of Classification Search
CPC ......................................................... H04B 1/04
See application file for complete search history.

(56) References Cited

U.S. PATENT DOCUMENTS

| 2005/0213672 A1* | 9/2005 | Lin | H03F 3/24 375/257 |
| 2016/0149552 A1* | 5/2016 | Kwak | H04B 1/04 375/295 |
| 2017/0338840 A1* | 11/2017 | Mao | H02M 3/156 |

OTHER PUBLICATIONS

EP Search Report and Written Opinion for EP17188532.0 datedc Mar. 12, 2018 (7 pages).

DVB Organization: "a078.pdf", DVB, Digital Video Broadcasting, c/o EBU—17A Ancienne Route—CH-1218 Grand Saconnex, Geneva—Switzerland, Aug. 16, 2004, XP017826870.
Wettroth, J M: "Adjustable LNB Power Supply is Diseqc-Compatible," Electronic Design, Penton Media, Cleveland, OH, US, vol. 46, No. 9, Apr. 20, 1998, XP000784768 (2 pages).
Eutelsat: "Digital Satellite Equipment Control (DiSEqC(TM)) Bus Functional Specification Version 4.2," Feb. 25, 1998, XP055366503, http://www.eutelsat.com/files/contributed/satellites/pdf/Diseqc/Reference docs/bus_spec.pdf (28 pages).

* cited by examiner

*Primary Examiner* — Dac Ha
(74) *Attorney, Agent, or Firm* — Crowe & Dunlevy

(57) ABSTRACT

Satellite controller circuitry includes a connection (i.e. coaxial or single wire with ground), with a control unit receiving a data message and generating a response message as output, and transmitter circuitry transmitting the response message. The transmitter circuitry has a first transistor having a first conduction terminal coupled to the connection, a second conduction terminal coupled to ground, and a control terminal coupled to receive output from the control unit, a second transistor having a first conduction terminal coupled to the connection, a second conduction terminal coupled to ground, and a control terminal coupled to receive the output from the control unit. The first and second transistors are configured such that a second current flowing through the first conduction terminal of the second transistor is in a non-unity ratioed relationship, or in a unity ratioed relationship, with a first current flowing through the first conduction terminal of the first transistor.

29 Claims, 9 Drawing Sheets

TRANSMITTER CIRCUIT AND METHOD FOR DIGITAL SATELLITE EQUIPMENT CONTROL

TECHNICAL FIELD

This disclosure is related to improved transmitter circuitry and associated method for use in digital satellite equipment control (DiSEqC™) communications that is capable of shaping transmitted signals. In general, the device of this disclosure can be utilized to generate sinusoidal, non-sinusoidal, or complex waveform communication signals for a single wire system in an improved manner.

BACKGROUND

A satellite TV system 50 is described with reference to FIGS. 1A, 1B, and 2. The satellite TV system 50 includes an outdoor unit 49, which includes a satellite dish 52 and an associated low-noise block downconverter (LNB) 54. The LNB 54 receives satellite multimedia or generic data signals, such as video data signals, comprised of a block of frequencies collected by the satellite dish 52, amplifies it, and downconverts the block of frequencies to a lower block of intermediate frequencies (IF). The LNB 54 sends the downconverted data signals to a set top box 58, in other words an integrated receiver decoder, via coaxial connection 100, which serves to demodulate the downconverted video data signals for display by a television 60 or for storage in a storage device. In practice satellite TV system may have multiple dishes and various types of LNBs connected through a cascade of switchers, multi-switches, etc. These Digital Satellite Equipment (DSE) along with other Pieces of intelligent satellite peripheral slave equipment may be connected to the coaxial connection 100. Each of these devices may have to respond to DiSEqC commands issued by the master (integrated receiver decoder i.e., a set top box). Each of these digital satellite equipment (DSE), or stated another way, Satellite Peripheral equipment (SPE) may include a transceiver-controller circuit 56. It is also possible for multiple collocated SPEs to share the transceiver-controller. One such SPE 48 which may be present in a installation is shown in FIG. 1A The transceiver-Controller circuitry 56 is also coupled to the coaxial connection 100. The outdoor circuitry 56 includes a DC/DC converter 57 (FIG. 2) that receives a power signal over the coaxial connection 100, and converts the received power signal from the set top box (STB) 58 for use by microcontroller (MCU) 108. Traditionally 13V or 18V is sent over the coaxial connection depending on a desired polarization to be selected by the LNB 54 for a signal received by the satellite dish 52 and LNB 54. Some schemes use a fixed voltage such as 12V and rely on a DiSEqC message for selection of polarization. In some cases, some or all of the equipment may be self-powered instead of receiving power over the coaxial connection 100.

A Digital Satellite Equipment Control (DiSEqC) transceiver 55 functions in conjunction with the MCU 108 to permit the MCU 108 to receive commands, responses, or queries over the coaxial connection 100 transmitted using the DiSEqC standard, from set top box 58, and to permit the MCU 108 to transmit commands, queries, or responses over the coaxial connection 100

While existing DiSEqC transceiver 55 designs permit such bidirectional communication, drawbacks persist. For example, DiSEqC signals transmitted by the transceiver 55 may take the form of a trapezoidal or truncated triangular wave, making detection by the LNB 54 or set top box 58 more difficult, and consuming an undesirable amount of power or producing noise. Also, existing DiSEqC transceiver 55 designs may lack a desired degree of adaptability, calibration, and programmability.

Therefore, further development of such DiSEqC transceivers 55 is needed.

SUMMARY

Figure 1A:
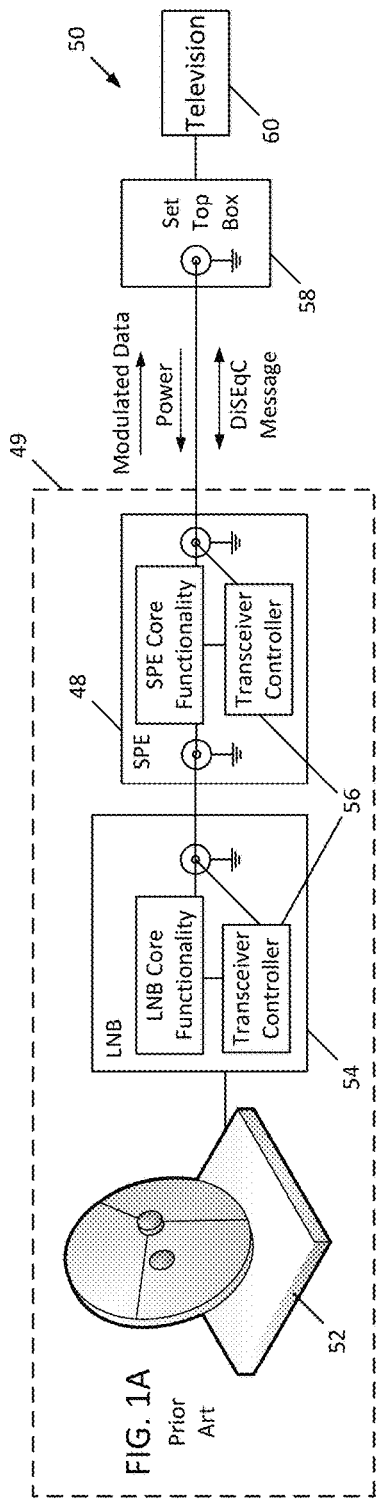
FIG. 1A is a block diagram of a known satellite TV system in accordance with the prior art.

This summary is provided to introduce a selection of concepts that are further described below in the detailed description. This summary is not intended to identify key or essential features of the claimed subject matter, nor is it intended to be used as an aid in limiting the scope of the claimed subject matter.

Satellite controller circuitry employed with this disclosure includes a coaxial connection, with a control unit receiving a data message over the coaxial connection and generating a response message as output, and transmitter circuitry transmitting the response message over the coaxial connection. The transmitter circuitry has a first transistor having a first conduction terminal coupled to the coaxial connection, a second conduction terminal coupled to ground, and a control terminal coupled to receive the output from the control unit, a second transistor having a first conduction terminal coupled to the coaxial connection, a second conduction terminal coupled to ground, and a control terminal coupled to receive the output from the control unit. The first and second transistors may be configured such that a second current flowing through the first conduction terminal of the second transistor is in a non-unity ratioed relationship with a first current flowing through the first conduction terminal of the first transistor, or in a unity ratioed relationship instead.

The first transistor may be coupled to a supply node through a first biasing resistor, and the second transistor may be coupled to the supply node through a second biasing resistor. The first and second transistor are configured such that the second current flowing through the first conduction terminal of the second transistor is in a non-unity ratioed relationship with the first current flowing through the first conduction terminal of the first transistor by at least one of: a size of the second transistor being different than a size of the first transistor, resistance values of the first and second biasing resistors being different, and the output of the control unit as received by the control terminal of the second transistor having a different current value than the output of the control unit as received by the control terminal of the first transistor. In some cases, the resistance values of the first and second biasing resistors may be the same, and other resistances within the circuit may be different.

The first conduction terminal of the first transistor may be coupled to the coaxial connection through a first energy dissipation resistor. In addition, the first conduction terminal of the second transistor may be coupled to the coaxial connection through a second energy dissipation resistor.

The combined effect of the biasing resistors and dissipating may determine the current flow. Furthermore, the control terminal of the first transistor may be coupled to receive the output from the control unit through a first decoupling resistor. The control terminal of the second transistor may be coupled to receive the output from the control unit through a second decoupling resistor.

The first transistor may be a first NPN bipolar junction transistor having a collector as its first conduction terminal, an emitter as its second conduction terminal, and a base as its control terminal. In addition, the second transistor may be a second NPN bipolar junction transistor having a collector as its first conduction terminal, an emitter as its second conduction terminal, and a base as its control terminal.

Another aspect is directed to electronic device that includes a satellite dish, a coaxial connection, a set top box coupled to the coaxial connection and configured to transmit a first data message over the coaxial connection addressing a peripheral equipment, and satellite receiver circuitry corresponding to peripheral equipment. The satellite receiver circuitry (e.g. LNB) is configured to receive output from the satellite dish and to downconvert video data therefrom. The electronic device includes satellite controller circuitry with a transceiver-controller unit configured to receive the first data message over the coaxial connection and to generate a response message as output based thereupon, and transmitter circuitry configured to transmit the response message over the coaxial connection. The transmitter circuitry includes a plurality of transistors, each transistor having a first conduction terminal coupled to the coaxial connection, a second conduction terminal coupled to ground, and a control terminal coupled to receive the output from the control unit. The plurality of transistors are configured such that currents respectively flowing through the first conduction terminals of each of the plurality of transistors are in non-unity ratioed relationships with one another, or in unity ratioed relationships with one another, or in a combination of unity and non-unity ratioed relationships with one another. The usage of a plurality of transistors enables generation of response in a controlled manner by a voltage drop caused due to current flow through various combinations of dissipation & biasing resistors of the transmitter circuit. Microcontroller Software or/and control logic circuit can determine the sequence and pattern of transistors to be turned on to generate desired waveform. The method can also decide on installation specific waveform aimed at optimization in terms of power requirement etc.

DETAILED DESCRIPTION

One or more embodiments of the present disclosure will be described below. These described embodiments are only examples of the presently disclosed techniques. Additionally, in an effort to provide a concise description, some features of an actual implementation may not be described in the specification. When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements.

Figure 1B:
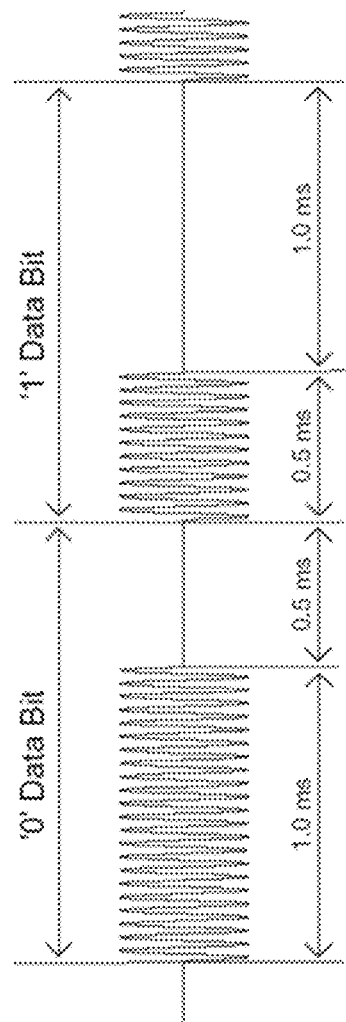
FIG. 1B is a graph showing the DiSEqC modulation scheme used to construct a message.
Figure 2:
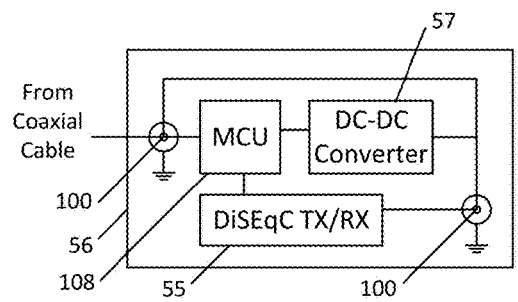
FIG. 2 is a schematic block diagram of the Transceiver-Controller used in digital satellite equipment of FIG. 1.
Figure 3:
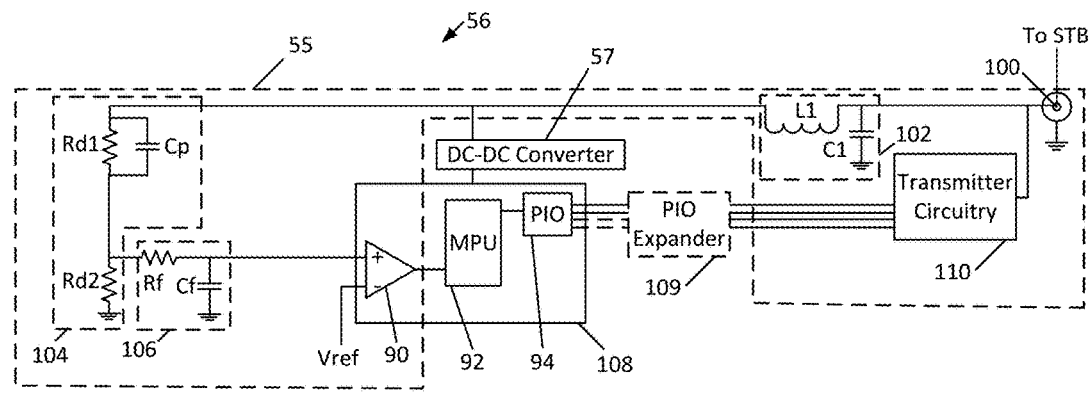
FIG. 3 is a schematic block diagram of a MCU and DiSEqC transceiver such as may be used in FIG. 2, in accordance with this disclosure.

With reference to FIG. 3, a DiSEqC transceiver 55 and microcontroller 108 are now described. The transceiver 55 includes a filter 102 to filter incoming and outgoing signals to the coaxial connection 100. The filter 102 is comprised of an inductor L1 coupled in line along the coaxial connection 100 and a capacitor C1 coupled between the coaxial connection 100 and ground. The filter 102 serves to help prevent injection of noise into the system, however in some applications, the filter 102 may be bypassed or reduced while transmitting DiSEqC signals. In some cases, the filter 102 can be realized via PCB tracks, particularly where potential incremental steps of the transmitter waveform are smaller. The DiSEqC signals transmit data using a chopped 22 kHz wave and amplitude modulation, as shown in FIG. 1B. The DiSEqC signals have a nominal amplitude of 650 mV (±250 mV) peak to peak, with a maximum amplitude of 1 V peak to peak. The 22 kHz signal rides on the 13/18 V supply on the coaxial cable 100.

The potential divider conditioner circuit 104 includes a parallel coupled resistor Rd1 and capacitor Cp in series with resistor Rd2. The resistors Rd1 and Rd2 act as a potential divider to scale down the voltage at the coaxial cable 100, however capacitor Cp allows for a lower impedance path for the 22 KHz signal and is thus attenuated to a lesser degree by this divider.

A low pass filter 106 can be optionally used to suppress high frequency noise. The low pass filter 106 includes an in-line resistor Rf coupled to a non-inverting terminal of amplifier 90, which receives digital replicas of the received sinusoidal signal, as well as a capacitor Cf coupled between the non-inverting terminal of amplifier 90 and ground. The amplifier 90 is used as a comparator. Filter Rf and Cf help to eliminate high frequency noise to increase reliability. It is possible eliminate the filter 106 by means of suitable PCB layout. It is also possible to place Rd2 in parallel with Cf at the input of the amplifier 90.

The output of amplifier 90 is a digital pulse signal forming a replica of a chopped sinusoidal waveform generated in accordance with the DiSEqC standard, and is fed to microprocessor 92. Microprocessor 92 reads the DiSEqC signal, which may be a command, query, or response, and generates a command, query, or response based thereupon. Microprocessor 92 passes the command, query, or response that it has generated to the peripheral I/O (PIO) block 94, which serves to format the command, query, or response for transmission by the transmitter circuitry 110 and subsequent transmission over the coaxial connection 100.

Figure 4:
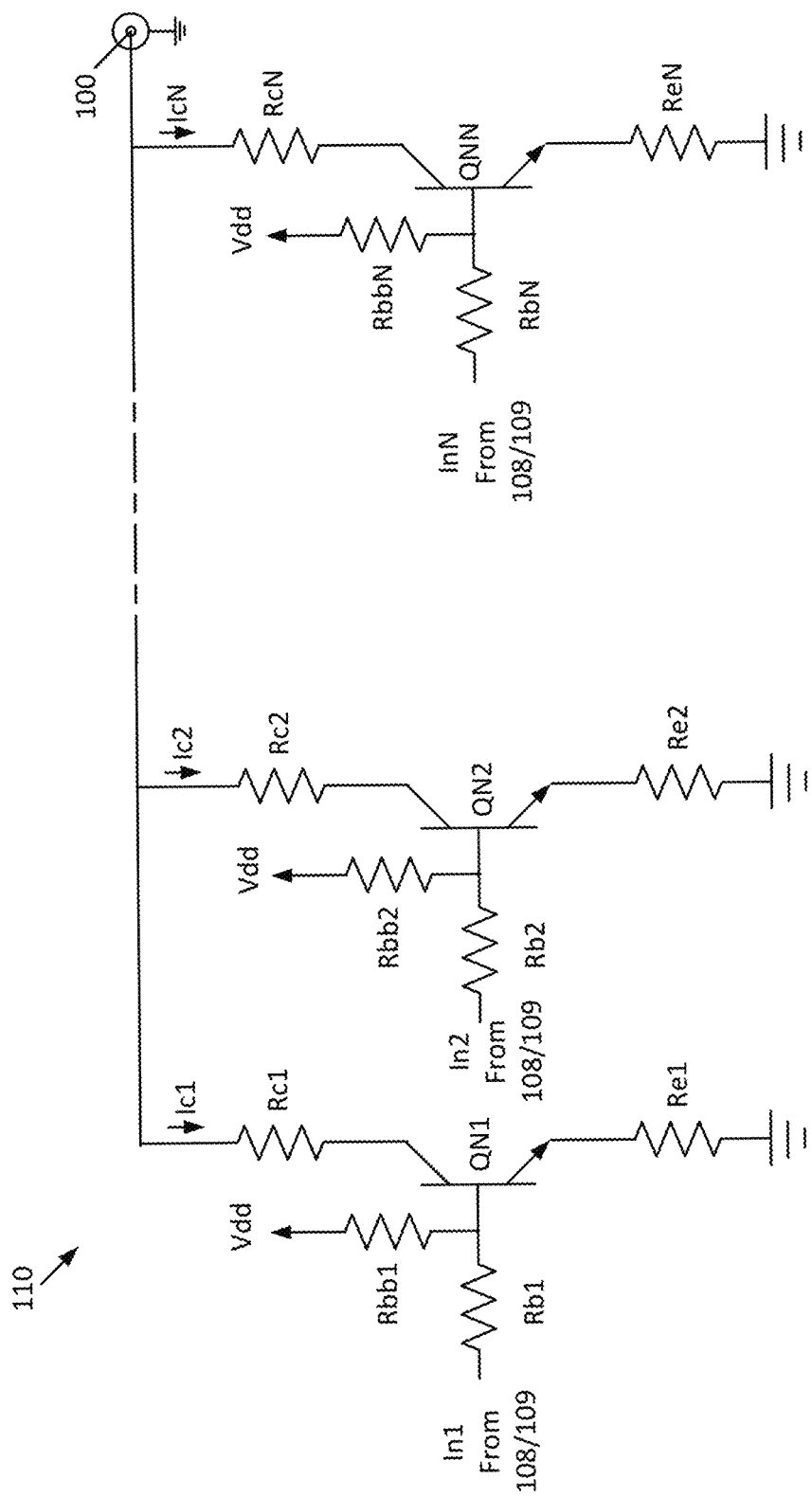
FIG. 4 is a schematic diagram of the transmitter circuitry of FIG. 3, in accordance with this disclosure.

With additional reference to FIG. 4, details of the transmitter circuitry 110 are now given. The transmitter circuitry 110 includes NPN bipolar junction transistor QN1 having a collector coupled to the coaxial connection 100 through power dissipating resistor Rc1 that serves to produce a predetermined amount of drop in the conduction path involving the dissipation resistor and other components, and an emitter coupled to ground through bias resistor Re1. Resistor Rb1 is coupled in line with the base of transistor QN1 and serves to decouple the received DiSEqC signal In1 from PIO 94 or/and PIO expander 109, and a bias resistor Rbb1 is coupled between the base of transistor QN1 and a supply node Vdd.

The transmitter circuitry 110 also includes NPN bipolar junction transistor QN2 having a collector coupled to the coaxial connection 100 through power dissipating resistor Rc2 that serves to produce a predetermined amount of drop and an emitter coupled to ground through bias resistor Re2. Resistor Rb2 is coupled in line with the base of transistor QN2 and serves to decouple the received DiSEqC signal In2 from PIO 94 or/and PIO expander 109, and a bias resistor Rbb2 is coupled between the base of transistor QN2 and a supply node Vdd. It should be noted that the PIO expander 109 may include additional logic to help offload a portion of the work performed by the microprocessor 92.

The transmitter circuitry 110 includes NPN bipolar junction transistor QNN having a collector coupled to the coaxial connection 100 through power dissipating resistor RcN that serves to to produce a predetermined amount of drop, and an emitter coupled to ground through bias resistor ReN. Resistor RbN is coupled in line with the base of transistor QNN and serves to decouple the received DiSEqC signal InN from PIO 94 or/and PIO expander 109, and a bias resistor RbbN is coupled between the base of transistor QNN and a supply node Vdd. The use of "N" in the labeling of transistor "QNN", resistors "RcN", "ReN", "RbN", and "RbbN", and DiSEqC signal "InN" is used to denote and indicate that there may be any number N of such transistors QNN, each having associated therewith respective resistors "RcN", "ReN", "RbN", and "RbbN", and DiSEqC signal "InN". Thus, there may be only two transistors QN1-QN2 together with their associated resistors, there may be three transistors QN1-QN3 together with their associated resistors, there may be four transistors QN1-QN4 together with their associated resistors, etc. Indeed, there may be any number of transistors QN1-QNN together with their associated resistors. The PIO expander logic 109 can optionally be used to reduce No. of PIOs of the MCU used or to simplify Microcontroller SW. It is noted that the PIO expander 109 is shown as dotted, as it may be optional. Two PIO lines are likewise shown as dotted, although may be used in some cases.

The DiSEqC signals In1-InN each transmit the same message or data, and may be identical or may, as will be explained below, be different in current or voltage magnitude. These signals together produce the variation in coaxial voltage used for transmission of the message.

It should be appreciated that transistors QN1-QNN are each set up differently such that their respective collector currents, Ic1-IcN are in a non-unity (i.e. not 1:1) ratioed relationship, such as 5:3:2:1. These different collector currents Ic1-IcN may be effectuated by a variety of different ways, which may be used individually or in conjunction with one another. For example, the sizes of the transistors QN1-QNN may be ratioed so as to produce the desired ratioed collector currents Ic1-IcN. As another example, the voltage or current of the DiSEqC signals In1-InN may be ratioed so as to produce the desired ratioed collector currents Ic1-IcN. In addition, the biasing resistors Rbb1-RbbN, and/or the biasing resistors Re1-ReN, may be ratioed so as to produce the desired ratioed collector currents Ic1-IcN. A combination of any of these techniques may be utilized to produce the desired ratioed collector currents Ic1-IcN.

In some cases, transistors QN1-QNN may be set up such that their respective collector currents Ic1-IcN are in a unity ratioed relationship.

As shown in FIGS. 5A-5B, and 6A-6C, through the use of multiple transistors QN1-QNN providing collector currents Ic1-IcN in a ratioed relationship, an output signal more closely resembling a sinusoid (or another desired profile) can be produced. One cycle of a wave is shown. A set of such waves of appropriate durations would be used to comprise a message signal. Non-sinusoidal reference signal values may be calculated by the microprocessor 92 executing a suitable technique. The waveforms shown have almost sinusoidal properties due to significant contributions of the fundamental components so as to maintain compliance with DiSEqC specifications while at the same time optimizing desired properties.

As shown, with one transistor, the produced signal is trapezoidal, and with each added ratioed transistor, the produced signal gains more steps. This can be useful where the output signal is used to produce an interrupt beyond a threshold reducing power, thus using only enough amplitude to produce the interrupt, and can reduce power use through the generation of narrower waveforms. Moreover, the shape of the output signal itself can be tuned to the length of coaxial cable to be used.

Figure 5A:
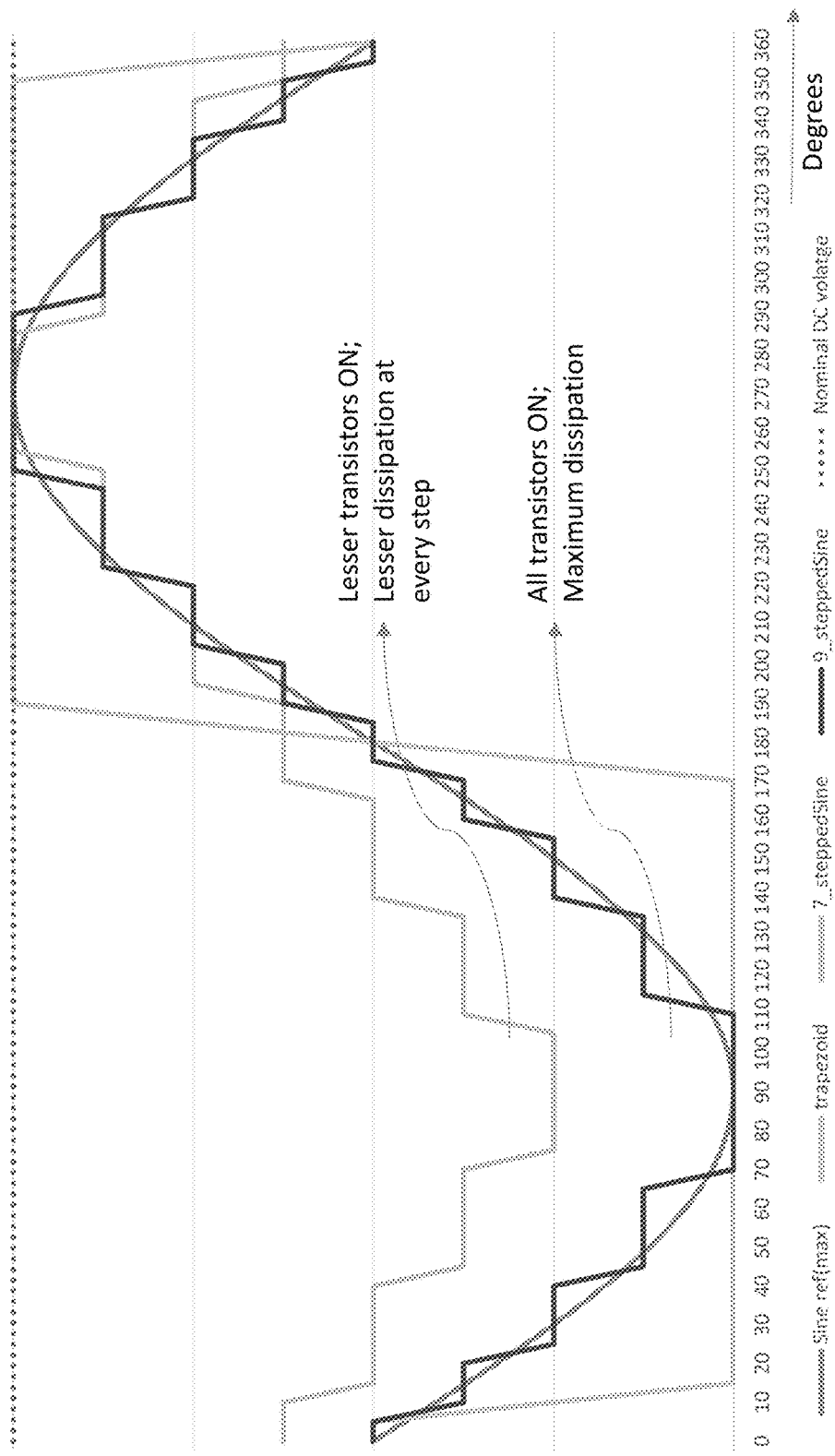
FIG. 5A is graphs of stepped output signals of controllable shape generated by unity ratioed DiSEqC transmitters with unity ratioed resistors described herein compared to trapezoidal signal generated by prior art DiSEqC transmitters and the ideal sinusoidal reference used in computation corresponding to the maximum possible amplitude.
Figure 5B:
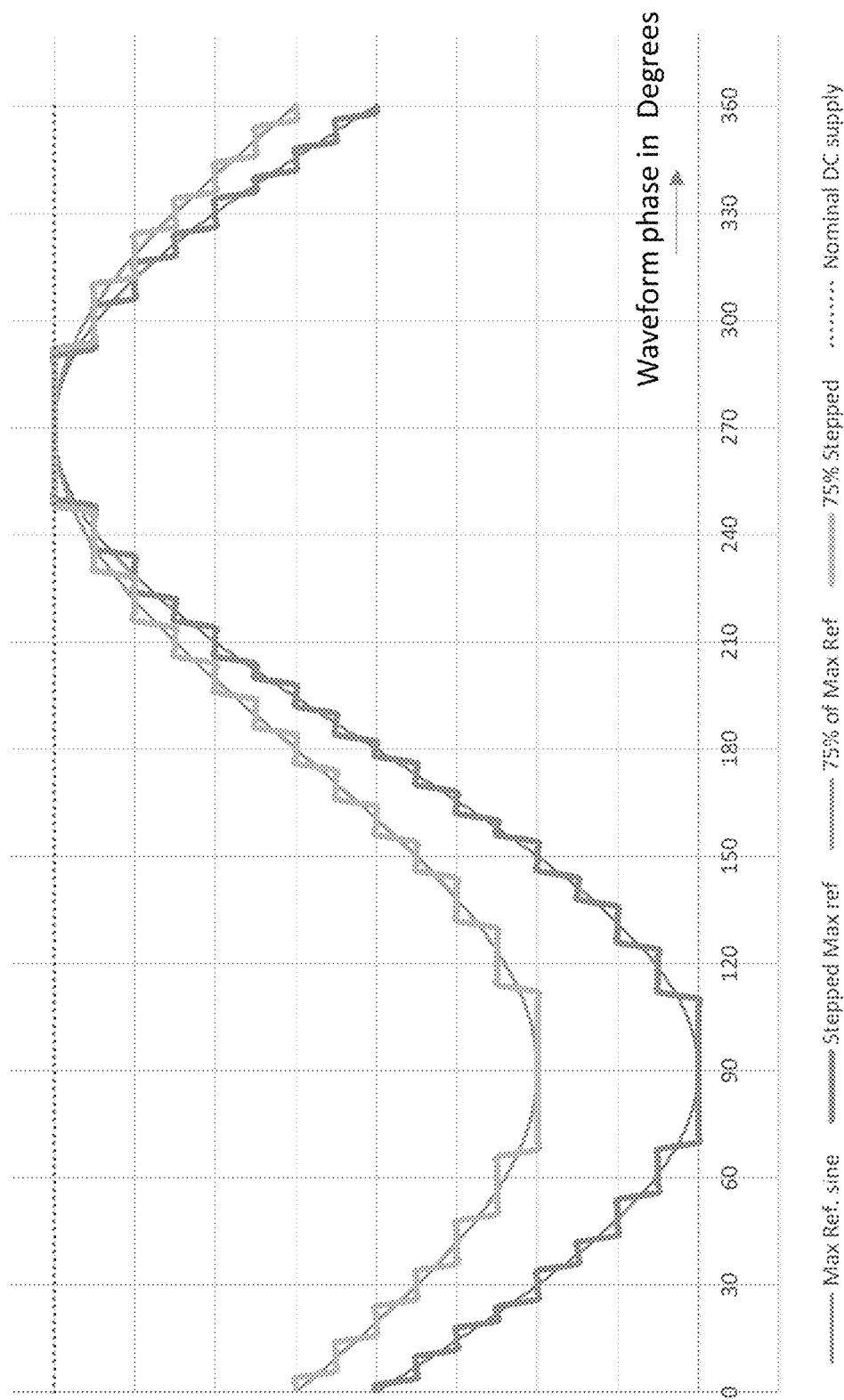
FIG. 5B is graph illustrating generation output signals of controlled amplitude and shape generated by the DiSEqC transmitters described herein compared to their corresponding ideal sinusoidal references used in computation and prior art DiSEqC transmitters, in which greater number of transistors can be activated than in FIG. 5A.

FIGS. 5A-5B show waveforms output by unity radioed transmitter 110 with 8 transistors. In particular, FIG. 5A compares stepped sinewaves with a trapezoidal output of the transmitter 110 using a single transistor. The stepped sinewave of a lesser amplitude is obtained by not utilizing two transistors and utilizing comparatively lesser transistors at each phase. Power dissipation is proportional to root mean square term of the waveform, so power saving is obtained due to the wave shape and due to possibility of using lesser amplitude. The microprocessor 92 makes the decision to turn on the required number of transistors to follow a desired reference waveform. FIG. 5B depicts smoother wave forms obtained with circuit containing 16 transistors corresponding to their ideal reference sinusoidal waveform. Minor reductions in supply voltage with turning of additional transistors are neglected in the depiction. In addition, the effect of filter and cable impedance is not shown to illustrate the principle of operation of the transmitter circuit 110.

Figure 6A:
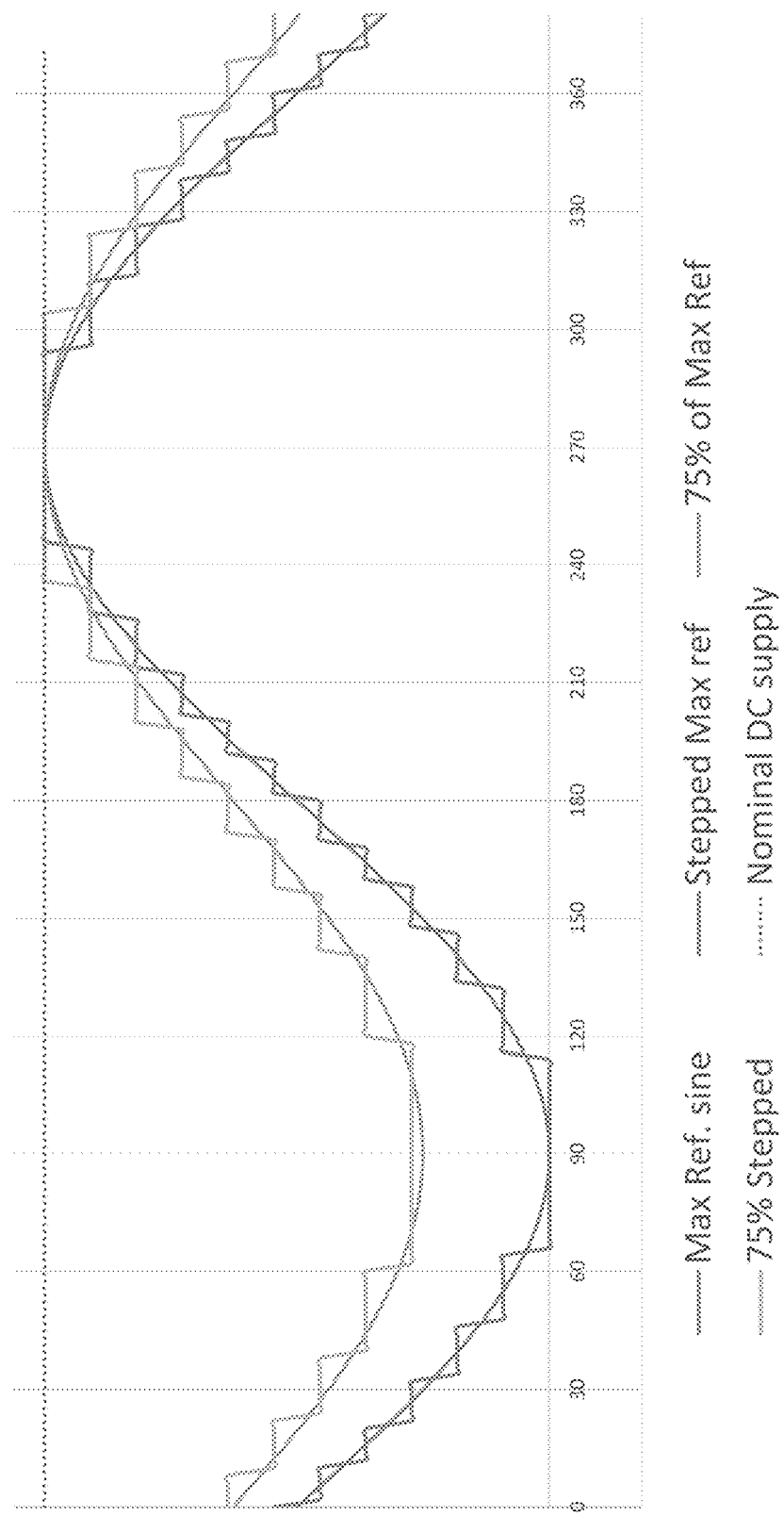
FIG. 6A is a graph of an output signal generated by the DiSEqC transmitters employing combinations of resistors of different weightages described herein compared to their respective ideal reference sinusoidal waves used in computation.
Figure 6B:
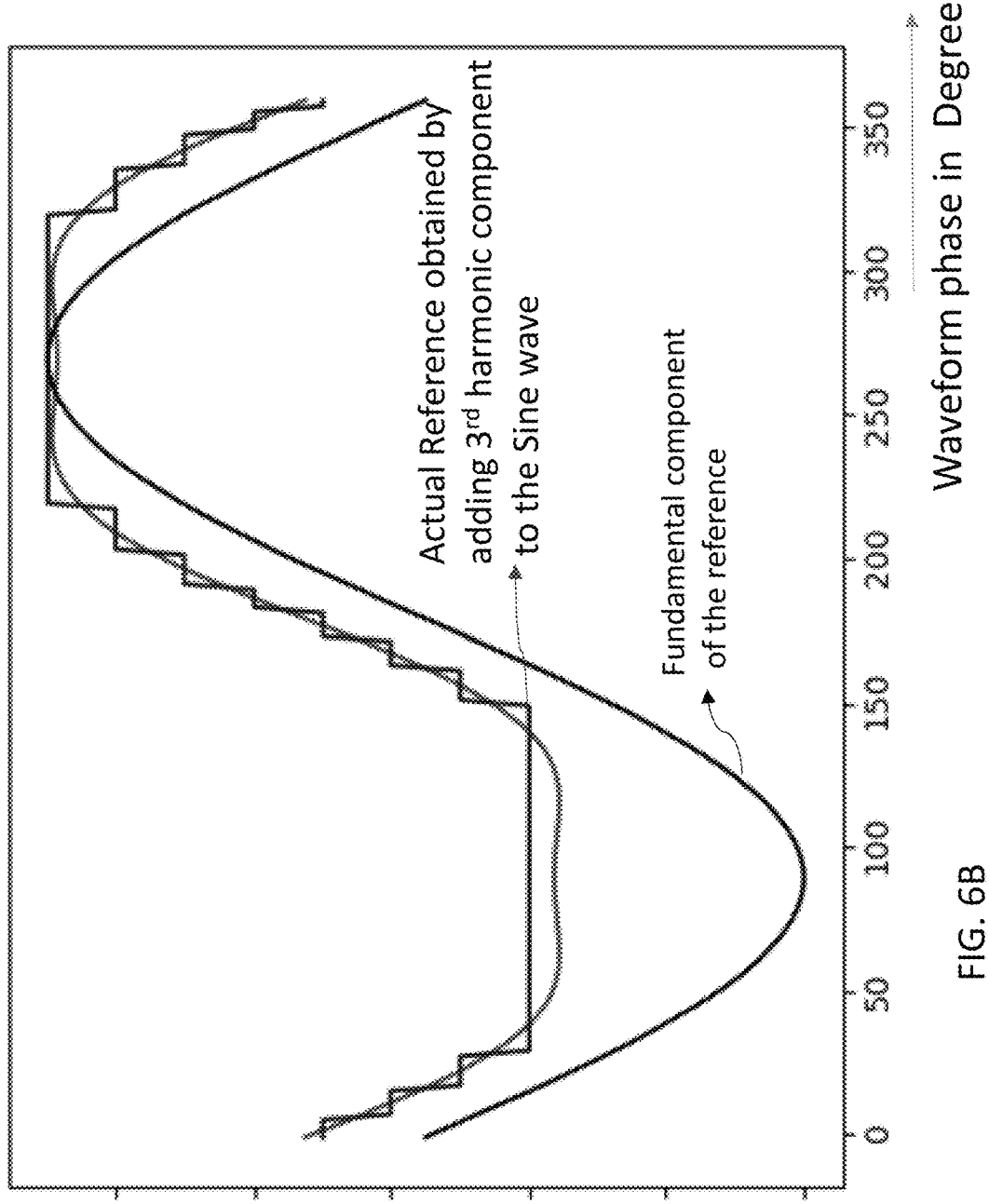
FIG. 6B shows the possibility to save power using a non-sinusoidal reference wave. The reference in this is case obtained by adding a $3^{rd}$ harmonic component where the peak power requirement is reduced but a threshold level for sensing with a digital circuit is achieved earlier.
Figure 6C:
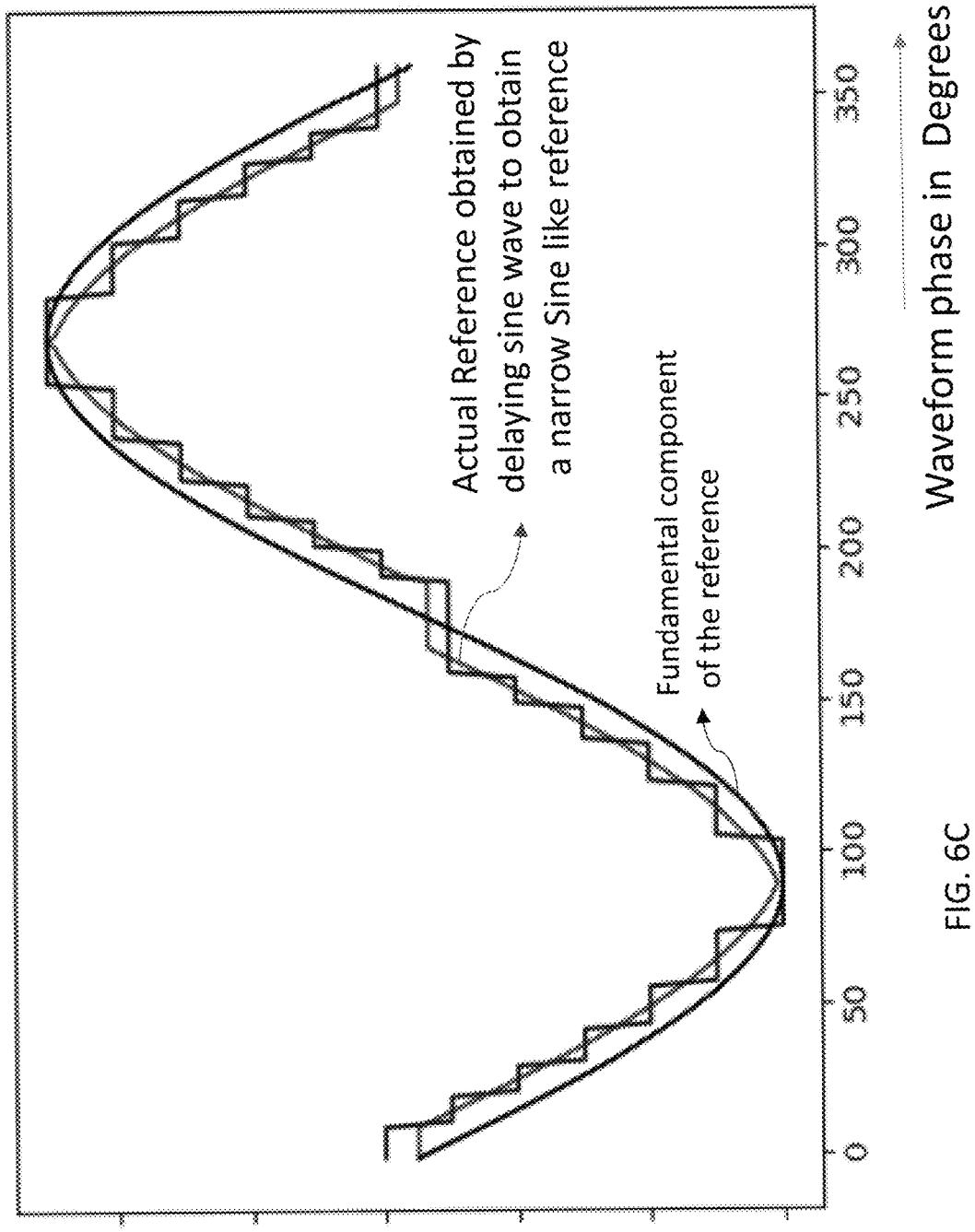
FIG. 6C shows a waveform that utilizes a thinner sine like reference to save power.
Figure 7:
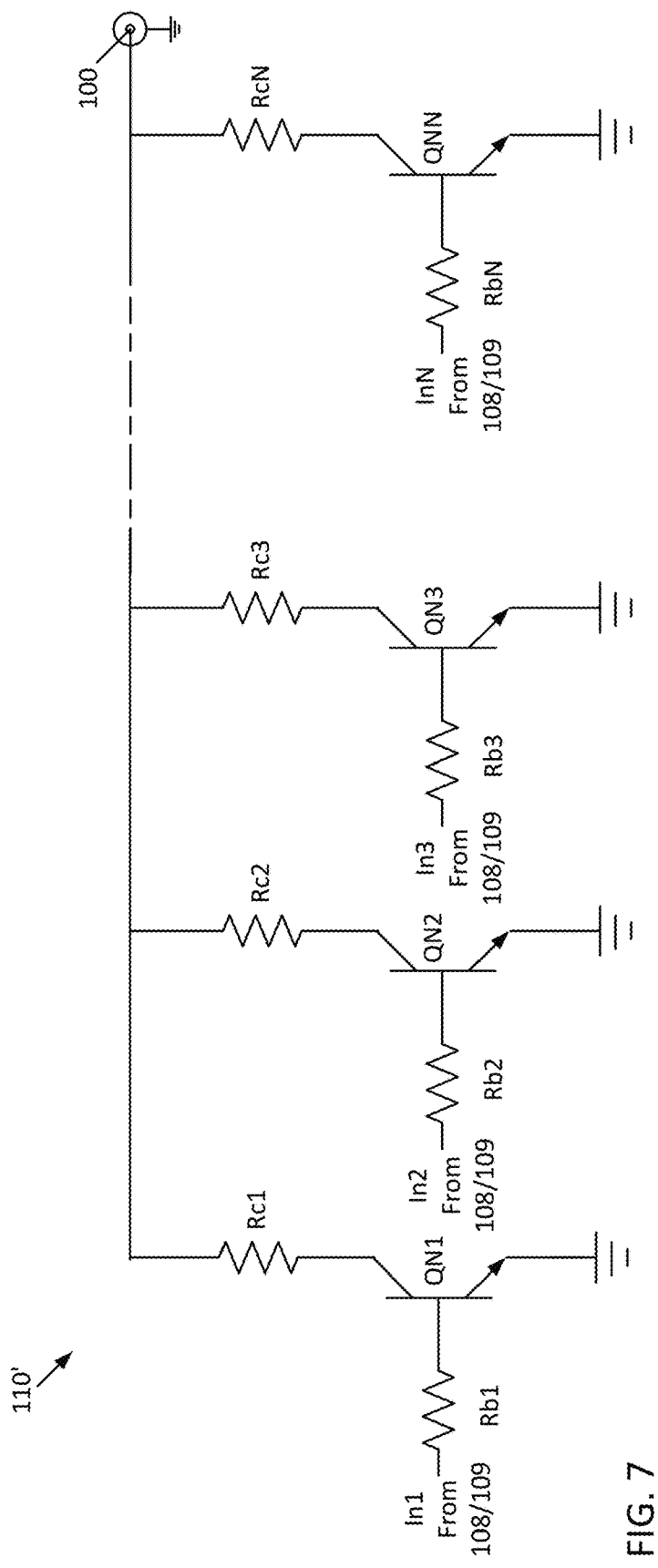
FIG. 7 is a schematic block diagram of an alternate MCU and DiSEqC transceiver similar to that of FIG. 3, in accordance with this disclosure.

FIGS. 6A-6C depict possible waveforms that can be generated using transmitter circuitry 110 with four transistor with different dissipation resistors selected to generate dissipation in the ratio of 5:3:2:1. FIG. 6A shows that a combination of 11 steps can be used to follow a sinusoidal reference of maximum amplitude with various combination of transistors. A lesser number of steps can be used to follow a sinusoidal waveform of lesser amplitude (75% in this case).

FIG. 6B shows generation of waveform following a non-sinusoidal reference, in this case obtained by adding 3rd harmonic component to a basic sinusoidal. This waveform is suitable for processing by a digital circuit (such as a microcontroller) where the digital equivalent is generated when the waveform is above a threshold level.

FIG. 6C shows use of narrow sine like reference aimed at saving power.

All though few possible schemes are descried, the schemes can be combined and or optimized further targeting optimization of additional characteristics.

Since multiple transistors are used to product the output signal, each transistor can have a lower current rating, helping with heat and power distribution. This helps in integration of the transmitter into an integrated circuit (IC). In addition, it should be understood that transistors of any type may be used, such as MOSFETs, or PNP bipolar junction transistors.

Alterative configurations will now be discussed. The DiSEqC transceiver 55 circuit need not include a filter 102 or may include a filter of lesser value without biasing resistors. Also, the transmitter circuitry 110 need not include biasing resistors Re1-ReN (such as shown in FIG. 4) or biasing resistors Rbb1-RbbN. Further, L1 and C1 can be realized using a PCB track.

Although the above has been described with deference to DiSEqC communications, other communications protocols such as frequency shift keying (FSK) may be used for transmission and reception of messages. Indeed, any communication technique that uses signal variation over a single wire and a ground may be used.

In some cases, a comparator based circuit with a programmable threshold may be used during a calibration process to determine optimal ratioing to be used among the collector currents Ic1-IcN. In fact, the calibration may be different for each peripheral device. For example, in some cases not all transistors may be used. In addition, the biasing of one or more of the transistors QN1-QNN may be such that the transistor operates in in the linear region to act as programmable resistor and this will provide even finer control of the output waveform.

It should be appreciated that the transmitter circuitry 110 may also be replicated for use in the set top box 58 such that it may be used there to transmit DiSEqC signals to the outdoor circuitry 56. Since in a typical installation, the set top box 58 also powers the outdoor circuitry 56, the transmitter circuitry 110 may interact with the power supply to allow a lower amount of regulation during at the time of transmission.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. Satellite controller circuitry, comprising:
    a connection;
    a control unit configured to receive a data message over the connection and to generate a response message as output based thereupon; and
    transmitter circuitry configured to transmit the response message over the connection, the transmitter circuitry comprising:
        a first transistor having a first conduction terminal coupled to the connection, a second conduction terminal coupled to ground, and a control terminal coupled to receive the output from the control unit; and
        a second transistor having a first conduction terminal coupled to the connection, a second conduction terminal coupled to ground, and a control terminal coupled to receive the output from the control unit;
    wherein the first and second transistor are configured such that a second current flowing through the first conduction terminal of the second transistor is in a non-unity ratioed relationship with a first current flowing through the first conduction terminal of the first transistor.

2. The satellite controller circuitry of claim 1, wherein the connecting comprises a coaxial connection or a single wire with ground connection.

3. The satellite controller circuitry of claim 1, wherein the first transistor is coupled to a supply node through a first biasing resistor; and wherein the second transistor is coupled to the supply node through a second biasing resistor.

4. The satellite controller circuitry of claim 3, wherein the non-unity ratioed relationship between the first and second currents of the first and second transistors is configured by resistance values of the first and second biasing resistors being different.

5. The satellite controller circuitry of claim 3, wherein the second conduction terminal of the first transistor is coupled to ground through a third biasing resistor; and wherein the second conduction terminal of the second transistor is coupled to ground through a fourth biasing resistor.

6. The satellite controller circuitry of claim 5, wherein the non-unity ratioed relationship between the first and second currents of the first and second transistors is configured by at least one of resistance values of the first and second biasing resistors being different and resistance values of the third and fourth biasing resistors being different.

7. The satellite controller circuitry of claim 3, wherein the first and second transistor are configured such that the second current flowing through the first conduction terminal of the second transistor is in a non-unity ratioed relationship with the first current flowing through the first conduction terminal of the first transistor by at least two of: a size of the second transistor being different than a size of the first transistor, resistance values of the first and second biasing resistors being different, and the output of the control unit as received by the control terminal of the second transistor having a different current value than the output of the control unit as received by the control terminal of the first transistor.

8. The satellite controller circuitry of claim 1, wherein the non-unity ratioed relationship between the first and second currents of the first and second transistors is configured by a size of the second transistor being different than a size of the first transistor.

9. The satellite controller circuitry of claim 1, wherein the non-unity ratioed relationship between the first and second currents of the first and second transistors is configured by the output of the control unit as received by the control terminal of the second transistor having a different current value than the output of the control unit as received by the control terminal of the first transistor.

10. The satellite controller circuitry of claim 1, wherein the first conduction terminal of the first transistor is coupled to the connection through a first energy dissipation resistor.

11. The satellite controller circuitry of claim 1, wherein the first conduction terminal of the second transistor is coupled to the connection through a second energy dissipation resistor.

12. The satellite controller circuitry of claim 11, wherein the first and second energy dissipation resistors are unequal where the first and second transistors are configured such that the second current flowing through the first conduction terminal of the second transistor is in a non-unity ratioed relationship with the first current flowing through the first conduction terminal of the first transistor.

13. The satellite controller circuitry of claim 1, wherein the control terminal of the first transistor is coupled to receive the output from the control unit through a first decoupling resistor.

14. The satellite controller circuitry of claim 1, wherein the control terminal of the second transistor is coupled to receive the output from the control unit through a second decoupling resistor.

15. The satellite controller circuitry of claim 1, wherein the first transistor comprises a first NPN bipolar junction transistor having a collector as its first conduction terminal, an emitter as its second conduction terminal, and a base as its control terminal.

16. The satellite controller circuitry of claim 1, wherein the second transistor comprises a second NPN bipolar junction transistor having a collector as its first conduction terminal, an emitter as its second conduction terminal, and a base as its control terminal.

17. The satellite controller circuitry of claim 1, further comprising at least one additional transistor having a first conduction terminal coupled to the connection, a second conduction terminal coupled to ground, and a control terminal coupled to receive the output from the control unit and being coupled to a supply node through a second additional biasing resistor; and wherein the first transistor, second transistor, and at least one additional transistor are configured such that a second current flowing through the first conduction terminal of the second transistor is in a non-unity ratioed relationship with a first current flowing through the first conduction terminal of the first transistor, and such that an additional current flowing through the first conduction terminal of the at least one additional transistor is in a non-unity ratioed relationship with the second current flowing through the first conduction terminal of the second transistor and the first current flowing through the first conduction terminal of the first transistor.

18. The satellite controller circuitry of claim 1, further comprising:
a third transistor having a first conduction terminal coupled to the connection, a second conduction terminal coupled to ground, and a control terminal coupled to receive the output from the control unit and being coupled to a supply node through a third biasing resistor; and
a fourth transistor having a first conduction terminal coupled to the connection, a second conduction terminal coupled to ground, and a control terminal coupled to receive the output from the control unit and being coupled to a supply node through a fourth biasing resistor;
wherein the first, second, third, and fourth transistors are configured such that first, second, third, and fourth currents respectively flowing through the first conduction terminals of the first, second, third, and fourth transistors are in non-unity ratioed relationships with one another;
wherein the non-unity ratioed relationship between the first current flowing through the first conduction terminal of the first transistor and the second current flowing through the first conduction terminal of the second transistor is 5 to 3;
wherein the non-unity ratioed relationship between the second current flowing through the first conduction terminal of the second transistor and the third current flowing through the first conduction terminal of the third transistor is 3 to 2;
wherein the non-unity ratioed relationship between the third current flowing through the first conduction terminal of the third transistor and the fourth current flowing through the first conduction terminal of the fourth transistor is 2 to 1.

19. The satellite controller circuitry of claim 1, further comprising:
a third transistor having a first conduction terminal coupled to the connection, a second conduction terminal coupled to ground, and a control terminal coupled to receive the output from the control unit and being coupled to a supply node through a third biasing resistor; and
a fourth transistor having a first conduction terminal coupled to the connection, a second conduction terminal coupled to ground, and a control terminal coupled to receive the output from the control unit and being coupled to a supply node through a fourth biasing resistor;
wherein the first, second, third, and fourth transistors are configured such that first, second, third, and fourth currents respectively flowing through the first conduction terminals of the first, second, third, and fourth transistors are in non-unity ratioed relationships with one another;
wherein the non-unity ratioed relationship between the first current flowing through the first conduction terminal of the first transistor and the second current flowing through the first conduction terminal of the second transistor is other than 5 to 3;
wherein the non-unity ratioed relationship between the second current flowing through the first conduction terminal of the second transistor and the third current flowing through the first conduction terminal of the third transistor is other than 3 to 2;
wherein the non-unity ratioed relationship between the third current flowing through the first conduction terminal of the third transistor and the fourth current flowing through the first conduction terminal of the fourth transistor is other than 2 to 1.

20. An electronic device, comprising:
a satellite dish;
a connection;
a set top box coupled to the connection and configured to transmit a first data message over the connection;
satellite receiver circuitry configured to receive output from the satellite dish and to downconvert video data therefrom; and
satellite controller circuitry comprising:
a control unit configured to receive the first data message over the connection and to generate a response message as output based thereupon; and
transmitter circuitry configured to transmit the response message over the connection, the transmitter circuitry comprising a plurality of transistors, each transistor having a first conduction terminal coupled to the connection, a second conduction terminal coupled to ground, and a control terminal coupled to receive the output from the control unit;
wherein the plurality of transistors are configured such that such that currents respectively flowing through the first conduction terminals of each of the plurality of transistors are in non-unity ratioed relationships or unity ratioed relationships with one another.

21. The electronic device of claim 20, wherein the non-unity ratioed relationships result from at least one of: sizes of ones of the plurality of transistors being different from one another, and the output of the control unit as received by the control terminals of different ones of the plurality of transistors having different current values.

22. The electronic device of claim 21, wherein the non-unity ratioed relationships between the first current, second current, and third current are 5 to 3 to 2.

23. The electronic device of claim 20, wherein each of the plurality of transistors has at least one resistor coupled to bias the first conduction terminal thereof; and wherein the non-unity ratioed relationships result from at least one of: sizes of ones of the plurality of transistors being different from one another, resistance values of the at least one resistor each of the plurality of transistors being different from resistance values of the at least one resistor of others of the plurality of transistors, and the output of the control unit as received by the control terminals of different ones of the plurality of transistors having different current values.

24. The electronic device of claim 20, wherein each of the plurality of transistors has at least one resistor coupled to bias the second conduction terminal thereof; and wherein the non-unity ratioed relationships result from at least one of: sizes of ones of the plurality of transistors being different from one another, resistance values of the at least one resistor each of the plurality of transistors being different from resistance values of the at least one resistor of others of the plurality of transistors, and the output of the control unit as received by the control terminals of different ones of the plurality of transistors having different current values.

25. The electronic device of claim 20, further comprising a filter circuit coupled to the connection.

26. The electronic device of claim 20, wherein the transmitter circuitry is integrated within an integrated circuit.

27. The electronic device of claim 20, wherein the transmitter circuitry is embodied within an integrated circuit.

28. A method of transmitting a DiSEqC signal, comprising:
receiving, at a control unit, a data message over a connection;
generating a response message as output based the received data message;
transmitting the response message over the connection using transmitter circuitry comprising a plurality of transistors, with each transistor having a first conduction terminal coupled to the connection, a second conduction terminal coupled to ground, and a control terminal coupled to receive the output from the control unit;
prior to transmission, configuring the plurality of transistors such that such that currents respectively flowing through the first conduction terminals of each of the plurality of transistors are in desired unity or non-unity ratioed relationships with one another.

29. The method of claim 28, wherein the configuration of the plurality of transistors is performed using a microprocessor.

* * * * *